United States Patent
Xiao et al.

(10) Patent No.: US 9,230,565 B1
(45) Date of Patent: Jan. 5, 2016

(54) MAGNETIC SHIELD FOR MAGNETIC RECORDING HEAD

(71) Applicant: Western Digital (Fremont), LLC, Fremont, CA (US)

(72) Inventors: Rongfu Xiao, Dublin, CA (US); Daniele Mauri, San Jose, CA (US); Ming Mao, Dublin, CA (US); Haiwen Xi, San Jose, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 0 days.

(21) Appl. No.: 14/313,069

(22) Filed: Jun. 24, 2014

(51) Int. Cl.
*G11B 5/39* (2006.01)
*G11B 5/11* (2006.01)

(52) U.S. Cl.
CPC . *G11B 5/11* (2013.01); *G11B 5/112* (2013.01)

(58) Field of Classification Search
CPC .................. G11B 5/3912; G11B 5/11; G11B 2005/3996; G11B 5/112
USPC ............................ 360/319, 125.3, 324–324.2
See application file for complete search history.

(56) References Cited

U.S. PATENT DOCUMENTS

| | | | |
|---|---|---|---|
| 4,236,946 A * | 12/1980 | Aboaf et al. ................ | 148/108 |
| 5,838,521 A | 11/1998 | Ravipati | |
| 6,016,290 A | 1/2000 | Chen et al. | |
| 6,018,441 A | 1/2000 | Wu et al. | |
| 6,025,978 A | 2/2000 | Hoshi et al. | |
| 6,025,988 A | 2/2000 | Yan | |
| 6,032,353 A | 3/2000 | Hiner et al. | |
| 6,033,532 A | 3/2000 | Minami | |
| 6,034,851 A | 3/2000 | Zarouri et al. | |
| 6,043,959 A | 3/2000 | Crue et al. | |
| 6,046,885 A | 4/2000 | Aimonetti et al. | |
| 6,049,650 A | 4/2000 | Jerman et al. | |
| 6,055,138 A | 4/2000 | Shi | |
| 6,058,094 A | 5/2000 | Davis et al. | |
| 6,073,338 A | 6/2000 | Liu et al. | |
| 6,078,479 A | 6/2000 | Nepela et al. | |
| 6,081,499 A | 6/2000 | Berger et al. | |
| 6,094,803 A | 8/2000 | Carlson et al. | |
| 6,099,362 A | 8/2000 | Viches et al. | |
| 6,103,073 A | 8/2000 | Thayamballi | |
| 6,108,166 A | 8/2000 | Lederman | |
| 6,118,629 A | 9/2000 | Huai et al. | |
| 6,118,638 A | 9/2000 | Knapp et al. | |
| 6,125,018 A | 9/2000 | Takagishi et al. | |
| 6,130,779 A | 10/2000 | Carlson et al. | |
| 6,134,089 A | 10/2000 | Barr et al. | |
| 6,136,166 A | 10/2000 | Shen et al. | |
| 6,137,661 A | 10/2000 | Shi et al. | |
| 6,137,662 A | 10/2000 | Huai et al. | |
| 6,160,684 A | 12/2000 | Heist et al. | |
| 6,163,426 A | 12/2000 | Nepela et al. | |
| 6,166,891 A | 12/2000 | Lederman et al. | |
| 6,173,486 B1 | 1/2001 | Hsiao et al. | |

(Continued)

FOREIGN PATENT DOCUMENTS

JP 2009238259 A * 10/2009

*Primary Examiner* — Will J Klimowicz (57) ABSTRACT

A magnetic shield for a magnetic recording head includes a plurality of ferromagnetic layers, a spacer layer, and a buffer layer, wherein the buffer layer includes Co, Fe, B, or a combination thereof and effectively reduces irregular grain growth within the ferromagnetic layers, the spacer layer includes Ru, and the ferromagnetic layers magnetically couple through each of the buffer layer and the spacer layer.

3 Claims, 6 Drawing Sheets

(56) References Cited

U.S. PATENT DOCUMENTS

| | | |
|---|---|---|
| 6,175,476 B1 | 1/2001 | Huai et al. |
| 6,178,066 B1 | 1/2001 | Barr |
| 6,178,070 B1 | 1/2001 | Hong et al. |
| 6,178,150 B1 | 1/2001 | Davis |
| 6,181,485 B1 | 1/2001 | He |
| 6,181,525 B1 | 1/2001 | Carlson |
| 6,185,051 B1 | 2/2001 | Chen et al. |
| 6,185,077 B1 | 2/2001 | Tong et al. |
| 6,185,081 B1 | 2/2001 | Simion et al. |
| 6,188,549 B1 | 2/2001 | Wiitala |
| 6,190,764 B1 | 2/2001 | Shi et al. |
| 6,193,584 B1 | 2/2001 | Rudy et al. |
| 6,195,229 B1 | 2/2001 | Shen et al. |
| 6,198,608 B1 | 3/2001 | Hong et al. |
| 6,198,609 B1 | 3/2001 | Barr et al. |
| 6,201,673 B1 | 3/2001 | Rottmayer et al. |
| 6,204,998 B1 | 3/2001 | Katz |
| 6,204,999 B1 | 3/2001 | Crue et al. |
| 6,212,153 B1 | 4/2001 | Chen et al. |
| 6,215,625 B1 | 4/2001 | Carlson |
| 6,219,205 B1 | 4/2001 | Yuan et al. |
| 6,221,218 B1 | 4/2001 | Shi et al. |
| 6,222,707 B1 | 4/2001 | Huai et al. |
| 6,229,782 B1 | 5/2001 | Wang et al. |
| 6,230,959 B1 | 5/2001 | Heist et al. |
| 6,233,116 B1 | 5/2001 | Chen et al. |
| 6,233,125 B1 | 5/2001 | Knapp et al. |
| 6,237,215 B1 | 5/2001 | Hunsaker et al. |
| 6,252,743 B1 | 6/2001 | Bozorgi |
| 6,255,721 B1 | 7/2001 | Roberts |
| 6,258,468 B1 | 7/2001 | Mahvan et al. |
| 6,266,216 B1 | 7/2001 | Hikami et al. |
| 6,271,604 B1 | 8/2001 | Frank, Jr. et al. |
| 6,275,354 B1 | 8/2001 | Huai et al. |
| 6,277,505 B1 | 8/2001 | Shi et al. |
| 6,282,056 B1 | 8/2001 | Feng et al. |
| 6,292,334 B1 | 9/2001 | Koike et al. |
| 6,296,955 B1 | 10/2001 | Hossain et al. |
| 6,297,955 B1 | 10/2001 | Frank, Jr. et al. |
| 6,304,414 B1 | 10/2001 | Crue, Jr. et al. |
| 6,307,715 B1 | 10/2001 | Berding et al. |
| 6,310,746 B1 | 10/2001 | Hawwa et al. |
| 6,310,750 B1 | 10/2001 | Hawwa et al. |
| 6,317,290 B1 | 11/2001 | Wang et al. |
| 6,317,297 B1 | 11/2001 | Tong et al. |
| 6,322,911 B1 | 11/2001 | Fukagawa et al. |
| 6,330,136 B1 | 12/2001 | Wang et al. |
| 6,330,137 B1 | 12/2001 | Knapp et al. |
| 6,333,830 B2 | 12/2001 | Rose et al. |
| 6,340,533 B1 | 1/2002 | Ueno et al. |
| 6,349,014 B1 | 2/2002 | Crue, Jr. et al. |
| 6,351,355 B1 | 2/2002 | Min et al. |
| 6,353,318 B1 | 3/2002 | Sin et al. |
| 6,353,511 B1 | 3/2002 | Shi et al. |
| 6,356,412 B1 | 3/2002 | Levi et al. |
| 6,358,635 B1 | 3/2002 | Min et al. |
| 6,359,779 B1 | 3/2002 | Frank, Jr. et al. |
| 6,369,983 B1 | 4/2002 | Hong |
| 6,376,964 B1 | 4/2002 | Young et al. |
| 6,377,535 B1 | 4/2002 | Chen et al. |
| 6,381,095 B1 | 4/2002 | Sin et al. |
| 6,381,105 B1 | 4/2002 | Huai et al. |
| 6,389,499 B1 | 5/2002 | Frank, Jr. et al. |
| 6,392,850 B1 | 5/2002 | Tong et al. |
| 6,396,660 B1 | 5/2002 | Jensen et al. |
| 6,399,179 B1 | 6/2002 | Hanrahan et al. |
| 6,400,526 B2 | 6/2002 | Crue, Jr. et al. |
| 6,404,600 B1 | 6/2002 | Hawwa et al. |
| 6,404,601 B1 | 6/2002 | Rottmayer et al. |
| 6,404,706 B1 | 6/2002 | Stovall et al. |
| 6,410,170 B1 | 6/2002 | Chen et al. |
| 6,411,522 B1 | 6/2002 | Frank, Jr. et al. |
| 6,417,998 B1 | 7/2002 | Crue, Jr. et al. |
| 6,417,999 B1 | 7/2002 | Knapp et al. |
| 6,418,000 B1 | 7/2002 | Gibbons et al. |
| 6,418,048 B1 | 7/2002 | Sin et al. |
| 6,421,211 B1 | 7/2002 | Hawwa et al. |
| 6,421,212 B1 | 7/2002 | Gibbons et al. |
| 6,424,505 B1 | 7/2002 | Lam et al. |
| 6,424,507 B1 | 7/2002 | Lederman et al. |
| 6,430,009 B1 | 8/2002 | Komaki et al. |
| 6,430,806 B1 | 8/2002 | Chen et al. |
| 6,433,965 B1 | 8/2002 | Gopinathan et al. |
| 6,433,968 B1 | 8/2002 | Shi et al. |
| 6,433,970 B1 | 8/2002 | Knapp et al. |
| 6,437,945 B1 | 8/2002 | Hawwa et al. |
| 6,445,536 B1 | 9/2002 | Rudy et al. |
| 6,445,542 B1 | 9/2002 | Levi et al. |
| 6,445,553 B2 | 9/2002 | Barr et al. |
| 6,445,554 B1 | 9/2002 | Dong et al. |
| 6,447,935 B1 | 9/2002 | Zhang et al. |
| 6,448,765 B1 | 9/2002 | Chen et al. |
| 6,451,514 B1 | 9/2002 | Iitsuka |
| 6,452,742 B1 | 9/2002 | Crue et al. |
| 6,452,765 B1 | 9/2002 | Mahvan et al. |
| 6,456,465 B1 | 9/2002 | Louis et al. |
| 6,456,467 B1 | 9/2002 | Mao et al. |
| 6,459,552 B1 | 10/2002 | Liu et al. |
| 6,462,920 B1 | 10/2002 | Karimi |
| 6,466,401 B1 | 10/2002 | Hong et al. |
| 6,466,402 B1 | 10/2002 | Crue, Jr. et al. |
| 6,466,404 B1 | 10/2002 | Crue, Jr. et al. |
| 6,468,436 B1 | 10/2002 | Shi et al. |
| 6,469,877 B1 | 10/2002 | Knapp et al. |
| 6,477,019 B2 | 11/2002 | Matono et al. |
| 6,479,096 B1 | 11/2002 | Shi et al. |
| 6,483,662 B1 | 11/2002 | Thomas et al. |
| 6,487,040 B1 | 11/2002 | Hsiao et al. |
| 6,487,056 B1 | 11/2002 | Gibbons et al. |
| 6,490,125 B1 | 12/2002 | Barr |
| 6,496,330 B1 | 12/2002 | Crue, Jr. et al. |
| 6,496,334 B1 | 12/2002 | Pang et al. |
| 6,496,335 B2 | 12/2002 | Gill |
| 6,504,676 B1 | 1/2003 | Hiner et al. |
| 6,512,657 B2 | 1/2003 | Heist et al. |
| 6,512,659 B1 | 1/2003 | Hawwa et al. |
| 6,512,661 B1 | 1/2003 | Louis |
| 6,512,690 B1 | 1/2003 | Qi et al. |
| 6,515,573 B1 | 2/2003 | Dong et al. |
| 6,515,791 B1 | 2/2003 | Hawwa et al. |
| 6,532,823 B1 | 3/2003 | Knapp et al. |
| 6,535,363 B1 | 3/2003 | Hosomi et al. |
| 6,552,874 B1 | 4/2003 | Chen et al. |
| 6,552,928 B1 | 4/2003 | Qi et al. |
| 6,577,470 B1 | 6/2003 | Rumpler |
| 6,583,961 B2 | 6/2003 | Levi et al. |
| 6,583,968 B1 | 6/2003 | Scura et al. |
| 6,597,548 B1 | 7/2003 | Yamanaka et al. |
| 6,611,398 B1 | 8/2003 | Rumpler et al. |
| 6,618,223 B1 | 9/2003 | Chen et al. |
| 6,629,357 B1 | 10/2003 | Akoh |
| 6,633,464 B2 | 10/2003 | Lai et al. |
| 6,636,394 B1 | 10/2003 | Fukagawa et al. |
| 6,639,291 B1 | 10/2003 | Sin et al. |
| 6,650,503 B1 | 11/2003 | Chen et al. |
| 6,650,506 B1 | 11/2003 | Risse |
| 6,654,195 B1 | 11/2003 | Frank, Jr. et al. |
| 6,657,816 B1 | 12/2003 | Barr et al. |
| 6,661,621 B1 | 12/2003 | Iitsuka |
| 6,661,625 B1 | 12/2003 | Sin et al. |
| 6,674,610 B1 | 1/2004 | Thomas et al. |
| 6,680,863 B1 | 1/2004 | Shi et al. |
| 6,683,763 B1 | 1/2004 | Hiner et al. |
| 6,687,098 B1 | 2/2004 | Huai |
| 6,687,178 B1 | 2/2004 | Qi et al. |
| 6,687,977 B2 | 2/2004 | Knapp et al. |
| 6,691,226 B1 | 2/2004 | Frank, Jr. et al. |
| 6,697,294 B1 | 2/2004 | Qi et al. |
| 6,700,738 B1 | 3/2004 | Sin et al. |
| 6,700,759 B1 | 3/2004 | Knapp et al. |
| 6,704,158 B2 | 3/2004 | Hawwa et al. |
| 6,707,083 B1 | 3/2004 | Hiner et al. |
| 6,713,801 B1 | 3/2004 | Sin et al. |
| 6,721,138 B1 | 4/2004 | Chen et al. |

(56) References Cited

U.S. PATENT DOCUMENTS

| | | |
|---|---|---|
| 6,721,149 B1 | 4/2004 | Shi et al. |
| 6,721,203 B1 | 4/2004 | Qi et al. |
| 6,724,569 B1 | 4/2004 | Chen et al. |
| 6,724,572 B1 | 4/2004 | Stoev et al. |
| 6,729,015 B2 | 5/2004 | Matono et al. |
| 6,735,850 B1 | 5/2004 | Gibbons et al. |
| 6,737,281 B1 | 5/2004 | Dang et al. |
| 6,744,608 B1 | 6/2004 | Sin et al. |
| 6,747,301 B1 | 6/2004 | Hiner et al. |
| 6,751,055 B1 | 6/2004 | Alfoqaha et al. |
| 6,754,049 B1 | 6/2004 | Seagle et al. |
| 6,756,071 B1 | 6/2004 | Shi et al. |
| 6,757,140 B1 | 6/2004 | Hawwa |
| 6,760,196 B1 | 7/2004 | Niu et al. |
| 6,762,910 B1 | 7/2004 | Knapp et al. |
| 6,765,756 B1 | 7/2004 | Hong et al. |
| 6,775,902 B1 | 8/2004 | Huai et al. |
| 6,778,358 B1 | 8/2004 | Jiang et al. |
| 6,781,927 B1 | 8/2004 | Heanuc et al. |
| 6,785,955 B1 | 9/2004 | Chen et al. |
| 6,791,793 B1 | 9/2004 | Chen et al. |
| 6,791,807 B1 | 9/2004 | Hikami et al. |
| 6,798,616 B1 | 9/2004 | Seagle et al. |
| 6,798,625 B1 | 9/2004 | Ueno et al. |
| 6,801,408 B1 | 10/2004 | Chen et al. |
| 6,801,411 B1 | 10/2004 | Lederman et al. |
| 6,803,615 B1 | 10/2004 | Sin et al. |
| 6,806,035 B1 | 10/2004 | Atireklapvarodom et al. |
| 6,807,030 B1 | 10/2004 | Hawwa et al. |
| 6,807,332 B1 | 10/2004 | Hawwa |
| 6,809,899 B1 | 10/2004 | Chen et al. |
| 6,816,345 B1 | 11/2004 | Knapp et al. |
| 6,828,897 B1 | 12/2004 | Nepela |
| 6,829,160 B1 | 12/2004 | Qi et al. |
| 6,829,819 B1 | 12/2004 | Crue, Jr. et al. |
| 6,833,979 B1 | 12/2004 | Knapp et al. |
| 6,834,010 B1 | 12/2004 | Qi et al. |
| 6,859,343 B1 | 2/2005 | Alfoqaha et al. |
| 6,859,997 B1 | 3/2005 | Tong et al. |
| 6,861,937 B1 | 3/2005 | Feng et al. |
| 6,870,712 B2 | 3/2005 | Chen et al. |
| 6,873,494 B2 | 3/2005 | Chen et al. |
| 6,873,547 B1 | 3/2005 | Shi et al. |
| 6,879,464 B2 | 4/2005 | Sun et al. |
| 6,888,184 B1 | 5/2005 | Shi et al. |
| 6,888,704 B1 | 5/2005 | Diao et al. |
| 6,891,702 B1 | 5/2005 | Tang |
| 6,894,871 B2 | 5/2005 | Alfoqaha et al. |
| 6,894,877 B1 | 5/2005 | Crue, Jr. et al. |
| 6,906,894 B2 | 6/2005 | Chen et al. |
| 6,909,578 B1 | 6/2005 | Missell et al. |
| 6,912,106 B1 | 6/2005 | Chen et al. |
| 6,934,113 B1 | 8/2005 | Chen |
| 6,934,129 B1 | 8/2005 | Zhang et al. |
| 6,940,688 B2 | 9/2005 | Jiang et al. |
| 6,942,824 B1 | 9/2005 | Li |
| 6,943,993 B2 | 9/2005 | Chang et al. |
| 6,944,938 B1 | 9/2005 | Crue, Jr. et al. |
| 6,947,258 B1 | 9/2005 | Li |
| 6,950,266 B1 | 9/2005 | McCaslin et al. |
| 6,954,332 B1 | 10/2005 | Hong et al. |
| 6,958,885 B1 | 10/2005 | Chen et al. |
| 6,961,221 B1 | 11/2005 | Niu et al. |
| 6,969,989 B1 | 11/2005 | Mei |
| 6,975,486 B2 | 12/2005 | Chen et al. |
| 6,987,643 B1 | 1/2006 | Seagle |
| 6,989,962 B1 | 1/2006 | Dong et al. |
| 6,989,972 B1 | 1/2006 | Stoev et al. |
| 7,006,327 B2 | 2/2006 | Krounbi et al. |
| 7,007,372 B1 | 3/2006 | Chen et al. |
| 7,012,832 B1 | 3/2006 | Sin et al. |
| 7,023,658 B1 | 4/2006 | Knapp et al. |
| 7,026,063 B2 | 4/2006 | Ueno et al. |
| 7,027,268 B1 | 4/2006 | Zhu et al. |
| 7,027,274 B1 | 4/2006 | Sin et al. |
| 7,035,046 B1 | 4/2006 | Young et al. |
| 7,041,985 B1 | 5/2006 | Wang et al. |
| 7,046,490 B1 | 5/2006 | Ueno et al. |
| 7,054,113 B1 | 5/2006 | Seagle et al. |
| 7,057,857 B1 | 6/2006 | Niu et al. |
| 7,059,868 B1 | 6/2006 | Yan |
| 7,092,195 B1 | 8/2006 | Liu et al. |
| 7,110,289 B1 | 9/2006 | Sin et al. |
| 7,111,382 B1 | 9/2006 | Knapp et al. |
| 7,113,366 B1 | 9/2006 | Wang et al. |
| 7,114,241 B2 | 10/2006 | Kubota et al. |
| 7,116,517 B1 | 10/2006 | He et al. |
| 7,124,654 B1 | 10/2006 | Davies et al. |
| 7,126,788 B1 | 10/2006 | Liu et al. |
| 7,126,790 B1 | 10/2006 | Liu et al. |
| 7,131,346 B1 | 11/2006 | Buttar et al. |
| 7,133,253 B1 | 11/2006 | Seagle et al. |
| 7,134,185 B1 | 11/2006 | Knapp et al. |
| 7,154,713 B2 * | 12/2006 | Watanabe et al. .............. 360/313 |
| 7,154,715 B2 | 12/2006 | Yamanaka et al. |
| 7,170,725 B1 | 1/2007 | Zhou et al. |
| 7,177,117 B1 | 2/2007 | Jiang et al. |
| 7,180,712 B1 | 2/2007 | Li et al. |
| 7,193,815 B1 | 3/2007 | Stoev et al. |
| 7,196,880 B1 | 3/2007 | Anderson et al. |
| 7,199,974 B1 | 4/2007 | Alfoqaha |
| 7,199,975 B1 | 4/2007 | Pan |
| 7,211,339 B1 | 5/2007 | Seagle et al. |
| 7,212,384 B1 | 5/2007 | Stoev et al. |
| 7,238,292 B1 | 7/2007 | He et al. |
| 7,239,478 B1 | 7/2007 | Sin et al. |
| 7,248,431 B1 | 7/2007 | Liu et al. |
| 7,248,433 B1 | 7/2007 | Stoev et al. |
| 7,248,449 B1 | 7/2007 | Seagle |
| 7,280,325 B1 | 10/2007 | Pan |
| 7,280,389 B2 | 10/2007 | Guo |
| 7,283,327 B1 | 10/2007 | Liu et al. |
| 7,284,316 B1 | 10/2007 | Huai et al. |
| 7,286,329 B1 | 10/2007 | Chen et al. |
| 7,289,303 B1 | 10/2007 | Sin et al. |
| 7,292,409 B1 | 11/2007 | Stoev et al. |
| 7,296,339 B1 | 11/2007 | Yang et al. |
| 7,307,814 B1 | 12/2007 | Seagle et al. |
| 7,307,818 B1 | 12/2007 | Park et al. |
| 7,310,204 B1 | 12/2007 | Stoev et al. |
| 7,318,947 B1 | 1/2008 | Park et al. |
| 7,333,295 B1 | 2/2008 | Medina et al. |
| 7,337,530 B1 | 3/2008 | Stoev et al. |
| 7,342,751 B2 * | 3/2008 | Nagasaka et al. .......... 360/324.1 |
| 7,342,752 B1 | 3/2008 | Zhang et al. |
| 7,349,170 B1 | 3/2008 | Rudman et al. |
| 7,349,179 B1 | 3/2008 | He et al. |
| 7,354,664 B1 | 4/2008 | Jiang et al. |
| 7,363,697 B1 | 4/2008 | Dunn et al. |
| 7,371,152 B1 | 5/2008 | Newman |
| 7,372,665 B1 | 5/2008 | Stoev et al. |
| 7,375,926 B1 | 5/2008 | Stoev et al. |
| 7,379,269 B1 | 5/2008 | Krounbi et al. |
| 7,386,933 B1 | 6/2008 | Krounbi et al. |
| 7,389,577 B1 | 6/2008 | Shang et al. |
| 7,417,832 B1 | 8/2008 | Erickson et al. |
| 7,419,891 B1 | 9/2008 | Chen et al. |
| 7,428,124 B1 | 9/2008 | Song et al. |
| 7,430,098 B1 | 9/2008 | Song et al. |
| 7,436,620 B1 | 10/2008 | Kang et al. |
| 7,436,638 B1 | 10/2008 | Pan |
| 7,440,220 B1 | 10/2008 | Kang et al. |
| 7,443,632 B1 | 10/2008 | Stoev et al. |
| 7,444,740 B1 | 11/2008 | Chung et al. |
| 7,493,688 B1 | 2/2009 | Wang et al. |
| 7,508,627 B1 | 3/2009 | Zhang et al. |
| 7,522,377 B1 | 4/2009 | Jiang et al. |
| 7,522,379 B1 | 4/2009 | Krounbi et al. |
| 7,522,382 B1 | 4/2009 | Pan |
| 7,542,246 B1 | 6/2009 | Song et al. |
| 7,551,406 B1 | 6/2009 | Thomas et al. |
| 7,552,523 B1 | 6/2009 | He et al. |
| 7,554,767 B1 | 6/2009 | Hu et al. |
| 7,583,466 B2 | 9/2009 | Kermiche et al. |

(56) References Cited

U.S. PATENT DOCUMENTS

| | | |
|---|---|---|
| 7,595,967 B1 | 9/2009 | Moon et al. |
| 7,606,007 B2 | 10/2009 | Gill |
| 7,639,457 B1 | 12/2009 | Chen et al. |
| 7,656,611 B2 | 2/2010 | Liu et al. |
| 7,660,080 B1 | 2/2010 | Liu et al. |
| 7,663,848 B1 * | 2/2010 | Huai et al. ............... 360/324.2 |
| 7,672,080 B1 | 3/2010 | Tang et al. |
| 7,672,086 B1 | 3/2010 | Jiang |
| 7,684,160 B1 | 3/2010 | Erickson et al. |
| 7,688,546 B1 | 3/2010 | Bai et al. |
| 7,691,434 B1 | 4/2010 | Zhang et al. |
| 7,695,761 B1 | 4/2010 | Shen et al. |
| 7,719,795 B2 | 5/2010 | Hu et al. |
| 7,726,009 B1 | 6/2010 | Liu et al. |
| 7,729,086 B1 | 6/2010 | Song et al. |
| 7,729,087 B1 | 6/2010 | Stoev et al. |
| 7,736,823 B1 | 6/2010 | Wang et al. |
| 7,785,666 B1 | 8/2010 | Sun et al. |
| 7,796,356 B1 | 9/2010 | Fowler et al. |
| 7,796,364 B2 | 9/2010 | Lin |
| 7,800,858 B1 | 9/2010 | Bajikar et al. |
| 7,813,085 B2 | 10/2010 | Anagawa et al. |
| 7,819,979 B1 | 10/2010 | Chen et al. |
| 7,829,264 B1 | 11/2010 | Wang et al. |
| 7,846,643 B1 | 12/2010 | Sun et al. |
| 7,855,854 B2 | 12/2010 | Hu et al. |
| 7,869,160 B1 | 1/2011 | Pan et al. |
| 7,872,824 B1 | 1/2011 | Macchioni et al. |
| 7,872,833 B2 | 1/2011 | Hu et al. |
| 7,894,244 B2 | 2/2011 | Hayakawa et al. |
| 7,910,267 B1 | 3/2011 | Zeng et al. |
| 7,911,735 B1 | 3/2011 | Sin et al. |
| 7,911,737 B1 | 3/2011 | Jiang et al. |
| 7,916,426 B2 | 3/2011 | Hu et al. |
| 7,918,013 B1 | 4/2011 | Dunn et al. |
| 7,968,219 B1 | 6/2011 | Jiang et al. |
| 7,982,989 B1 | 7/2011 | Shi et al. |
| 8,000,063 B2 | 8/2011 | Yamaguchi et al. |
| 8,008,912 B1 | 8/2011 | Shang |
| 8,012,804 B1 | 9/2011 | Wang et al. |
| 8,015,692 B1 | 9/2011 | Zhang et al. |
| 8,018,677 B1 | 9/2011 | Chung et al. |
| 8,018,678 B1 | 9/2011 | Zhang et al. |
| 8,024,748 B1 | 9/2011 | Moravec et al. |
| 8,072,705 B1 | 12/2011 | Wang et al. |
| 8,074,345 B1 | 12/2011 | Anguelouch et al. |
| 8,077,418 B1 | 12/2011 | Hu et al. |
| 8,077,434 B1 | 12/2011 | Shen et al. |
| 8,077,435 B1 | 12/2011 | Liu et al. |
| 8,077,557 B1 | 12/2011 | Hu et al. |
| 8,079,135 B1 | 12/2011 | Shen et al. |
| 8,081,403 B1 | 12/2011 | Chen et al. |
| 8,091,210 B1 | 1/2012 | Sasaki et al. |
| 8,097,846 B1 | 1/2012 | Anguelouch et al. |
| 8,104,166 B1 | 1/2012 | Zhang et al. |
| 8,116,043 B2 | 2/2012 | Leng et al. |
| 8,116,171 B1 | 2/2012 | Lee |
| 8,125,856 B1 | 2/2012 | Li et al. |
| 8,134,794 B1 | 3/2012 | Wang |
| 8,136,224 B1 | 3/2012 | Sun et al. |
| 8,136,225 B1 | 3/2012 | Zhang et al. |
| 8,136,805 B1 | 3/2012 | Lee |
| 8,141,235 B1 | 3/2012 | Zhang |
| 8,146,236 B1 | 4/2012 | Luo et al. |
| 8,149,536 B1 | 4/2012 | Yang et al. |
| 8,151,441 B1 | 4/2012 | Rudy et al. |
| 8,163,185 B1 | 4/2012 | Sun et al. |
| 8,164,760 B2 | 4/2012 | Willis |
| 8,164,855 B1 | 4/2012 | Gibbons et al. |
| 8,164,862 B2 * | 4/2012 | Zhang et al. ............... 360/324.1 |
| 8,164,864 B2 | 4/2012 | Kaiser et al. |
| 8,165,709 B1 | 4/2012 | Rudy |
| 8,166,631 B1 | 5/2012 | Tran et al. |
| 8,166,632 B1 | 5/2012 | Zhang et al. |
| 8,169,473 B1 | 5/2012 | Yu et al. |
| 8,171,618 B1 | 5/2012 | Wang et al. |
| 8,179,636 B1 | 5/2012 | Bai et al. |
| 8,191,237 B1 | 6/2012 | Luo et al. |
| 8,194,365 B1 | 6/2012 | Leng et al. |
| 8,194,366 B1 | 6/2012 | Li et al. |
| 8,196,285 B1 | 6/2012 | Zhang et al. |
| 8,200,054 B1 | 6/2012 | Li et al. |
| 8,203,800 B2 | 6/2012 | Li et al. |
| 8,208,350 B1 | 6/2012 | Hu et al. |
| 8,220,140 B1 | 7/2012 | Wang et al. |
| 8,222,599 B1 | 7/2012 | Chien |
| 8,223,463 B2 | 7/2012 | Katada et al. |
| 8,225,488 B1 | 7/2012 | Zhang et al. |
| 8,227,023 B1 | 7/2012 | Liu et al. |
| 8,228,633 B1 | 7/2012 | Tran et al. |
| 8,231,796 B1 | 7/2012 | Li et al. |
| 8,233,248 B1 | 7/2012 | Li et al. |
| 8,248,896 B1 | 8/2012 | Yuan et al. |
| 8,254,060 B1 | 8/2012 | Shi et al. |
| 8,257,597 B1 | 9/2012 | Guan et al. |
| 8,259,410 B1 | 9/2012 | Bai et al. |
| 8,259,539 B1 | 9/2012 | Hu et al. |
| 8,262,918 B1 | 9/2012 | Li et al. |
| 8,262,919 B1 | 9/2012 | Luo et al. |
| 8,264,797 B2 | 9/2012 | Emley |
| 8,264,798 B1 | 9/2012 | Guan et al. |
| 8,270,126 B1 | 9/2012 | Roy et al. |
| 8,276,258 B1 | 10/2012 | Tran et al. |
| 8,277,669 B1 | 10/2012 | Chen et al. |
| 8,279,719 B1 | 10/2012 | Hu et al. |
| 8,284,517 B1 | 10/2012 | Sun et al. |
| 8,288,204 B1 | 10/2012 | Wang et al. |
| 8,289,821 B1 | 10/2012 | Huber |
| 8,291,743 B1 | 10/2012 | Shi et al. |
| 8,307,539 B1 | 11/2012 | Rudy et al. |
| 8,307,540 B1 | 11/2012 | Tran et al. |
| 8,308,921 B1 | 11/2012 | Hiner et al. |
| 8,310,785 B1 | 11/2012 | Zhang et al. |
| 8,310,901 B1 | 11/2012 | Batra et al. |
| 8,315,019 B1 | 11/2012 | Mao et al. |
| 8,316,527 B2 | 11/2012 | Hong et al. |
| 8,320,076 B1 | 11/2012 | Shen et al. |
| 8,320,077 B1 | 11/2012 | Tang et al. |
| 8,320,219 B1 | 11/2012 | Wolf et al. |
| 8,320,220 B1 | 11/2012 | Yuan et al. |
| 8,320,722 B1 | 11/2012 | Yuan et al. |
| 8,322,022 B1 | 12/2012 | Yi et al. |
| 8,322,023 B1 | 12/2012 | Zeng et al. |
| 8,325,448 B2 | 12/2012 | Zhang et al. |
| 8,325,569 B1 | 12/2012 | Shi et al. |
| 8,333,008 B1 | 12/2012 | Sin et al. |
| 8,334,093 B2 | 12/2012 | Zhang et al. |
| 8,336,194 B2 | 12/2012 | Yuan et al. |
| 8,339,738 B1 | 12/2012 | Tran et al. |
| 8,341,826 B1 | 1/2013 | Jiang et al. |
| 8,343,319 B1 | 1/2013 | Li et al. |
| 8,343,364 B1 | 1/2013 | Gao et al. |
| 8,349,195 B1 | 1/2013 | Si et al. |
| 8,351,307 B1 | 1/2013 | Wolf et al. |
| 8,357,244 B1 | 1/2013 | Zhao et al. |
| 8,373,945 B1 | 2/2013 | Luo et al. |
| 8,375,564 B1 | 2/2013 | Luo et al. |
| 8,375,565 B2 | 2/2013 | Hu et al. |
| 8,381,391 B2 | 2/2013 | Park et al. |
| 8,385,025 B2 | 2/2013 | Maat et al. |
| 8,385,157 B1 | 2/2013 | Champion et al. |
| 8,385,158 B1 | 2/2013 | Hu et al. |
| 8,394,280 B1 | 3/2013 | Wan et al. |
| 8,400,731 B1 | 3/2013 | Li et al. |
| 8,404,128 B1 | 3/2013 | Zhang et al. |
| 8,404,129 B1 | 3/2013 | Luo et al. |
| 8,405,930 B1 | 3/2013 | Li et al. |
| 8,409,453 B1 | 4/2013 | Jiang et al. |
| 8,413,317 B1 | 4/2013 | Wan et al. |
| 8,416,540 B1 | 4/2013 | Li et al. |
| 8,419,953 B1 | 4/2013 | Su et al. |
| 8,419,954 B1 | 4/2013 | Chen et al. |
| 8,422,176 B1 | 4/2013 | Leng et al. |
| 8,422,342 B1 | 4/2013 | Lee |

(56) References Cited

U.S. PATENT DOCUMENTS

| | | |
|---|---|---|
| 8,422,841 B1 | 4/2013 | Shi et al. |
| 8,424,192 B1 | 4/2013 | Yang et al. |
| 8,441,756 B1 | 5/2013 | Sun et al. |
| 8,443,510 B1 | 5/2013 | Shi et al. |
| 8,444,866 B1 | 5/2013 | Guan et al. |
| 8,449,948 B2 | 5/2013 | Medina et al. |
| 8,451,556 B1 | 5/2013 | Wang et al. |
| 8,451,563 B1 | 5/2013 | Zhang et al. |
| 8,454,846 B1 | 6/2013 | Zhou et al. |
| 8,455,119 B1 | 6/2013 | Jiang et al. |
| 8,456,961 B1 | 6/2013 | Wang et al. |
| 8,456,963 B1 | 6/2013 | Hu et al. |
| 8,456,964 B1 | 6/2013 | Yuan et al. |
| 8,456,966 B1 | 6/2013 | Shi et al. |
| 8,456,967 B1 | 6/2013 | Mallary |
| 8,458,892 B2 | 6/2013 | Si et al. |
| 8,462,592 B1 | 6/2013 | Wolf et al. |
| 8,468,682 B1 | 6/2013 | Zhang |
| 8,472,288 B1 | 6/2013 | Wolf et al. |
| 8,480,911 B1 | 7/2013 | Osugi et al. |
| 8,486,285 B2 | 7/2013 | Zhou et al. |
| 8,486,286 B1 | 7/2013 | Gao et al. |
| 8,488,272 B1 | 7/2013 | Tran et al. |
| 8,491,801 B1 | 7/2013 | Tanner et al. |
| 8,491,802 B1 | 7/2013 | Gao et al. |
| 8,493,693 B1 | 7/2013 | Zheng et al. |
| 8,493,695 B1 | 7/2013 | Kaiser et al. |
| 8,495,813 B1 | 7/2013 | Hu et al. |
| 8,498,084 B1 | 7/2013 | Leng et al. |
| 8,506,828 B1 | 8/2013 | Osugi et al. |
| 8,514,517 B1 | 8/2013 | Batra et al. |
| 8,514,524 B2 * | 8/2013 | Wu et al. ........................ 360/319 |
| 8,518,279 B1 | 8/2013 | Wang et al. |
| 8,518,832 B1 | 8/2013 | Yang et al. |
| 8,520,336 B1 | 8/2013 | Liu et al. |
| 8,520,337 B1 | 8/2013 | Liu et al. |
| 8,524,068 B2 | 9/2013 | Medina et al. |
| 8,526,275 B1 | 9/2013 | Yuan et al. |
| 8,531,801 B1 | 9/2013 | Xiao et al. |
| 8,532,450 B1 | 9/2013 | Wang et al. |
| 8,533,937 B1 | 9/2013 | Wang et al. |
| 8,537,494 B1 | 9/2013 | Pan et al. |
| 8,537,495 B1 | 9/2013 | Luo et al. |
| 8,537,502 B1 | 9/2013 | Park et al. |
| 8,545,999 B1 | 10/2013 | Leng et al. |
| 8,547,659 B1 | 10/2013 | Bai et al. |
| 8,547,667 B1 | 10/2013 | Roy et al. |
| 8,547,730 B1 | 10/2013 | Shen et al. |
| 8,555,486 B1 | 10/2013 | Medina et al. |
| 8,559,141 B1 | 10/2013 | Pakala et al. |
| 8,563,146 B1 | 10/2013 | Zhang et al. |
| 8,565,049 B1 | 10/2013 | Tanner et al. |
| 8,576,517 B1 | 11/2013 | Tran et al. |
| 8,578,594 B2 | 11/2013 | Jiang et al. |
| 8,582,238 B1 | 11/2013 | Liu et al. |
| 8,582,241 B1 | 11/2013 | Yu et al. |
| 8,582,253 B1 | 11/2013 | Zheng et al. |
| 8,588,039 B1 | 11/2013 | Shi et al. |
| 8,593,914 B2 | 11/2013 | Wang et al. |
| 8,597,528 B1 | 12/2013 | Roy et al. |
| 8,599,520 B1 | 12/2013 | Liu et al. |
| 8,599,657 B1 | 12/2013 | Lee |
| 8,603,593 B1 | 12/2013 | Roy et al. |
| 8,607,438 B1 | 12/2013 | Gao et al. |
| 8,607,439 B1 | 12/2013 | Wang et al. |
| 8,611,035 B1 | 12/2013 | Bajikar et al. |
| 8,611,054 B1 | 12/2013 | Shang et al. |
| 8,611,055 B1 | 12/2013 | Pakala et al. |
| 8,614,864 B1 | 12/2013 | Hong et al. |
| 8,619,512 B1 | 12/2013 | Yuan et al. |
| 8,625,233 B1 | 1/2014 | Ji et al. |
| 8,625,941 B1 | 1/2014 | Shi et al. |
| 8,628,672 B1 | 1/2014 | Si et al. |
| 8,630,068 B1 | 1/2014 | Mauri et al. |
| 8,634,280 B1 | 1/2014 | Wang et al. |
| 8,638,529 B1 | 1/2014 | Leng et al. |
| 8,643,980 B1 | 2/2014 | Fowler et al. |
| 8,649,123 B1 | 2/2014 | Zhang et al. |
| 8,665,561 B1 | 3/2014 | Knutson et al. |
| 8,670,211 B1 | 3/2014 | Sun et al. |
| 8,670,213 B1 | 3/2014 | Zeng et al. |
| 8,670,214 B1 | 3/2014 | Knutson et al. |
| 8,670,294 B1 | 3/2014 | Shi et al. |
| 8,670,295 B1 | 3/2014 | Hu et al. |
| 8,675,318 B1 | 3/2014 | Ho et al. |
| 8,675,455 B1 | 3/2014 | Krichevsky et al. |
| 8,681,594 B1 | 3/2014 | Shi et al. |
| 8,689,430 B1 | 4/2014 | Chen et al. |
| 8,693,141 B1 | 4/2014 | Elliott et al. |
| 8,703,397 B1 | 4/2014 | Zeng et al. |
| 8,705,205 B1 | 4/2014 | Li et al. |
| 8,711,518 B1 | 4/2014 | Zeng et al. |
| 8,711,528 B1 | 4/2014 | Xiao et al. |
| 8,717,709 B1 | 5/2014 | Shi et al. |
| 8,720,044 B1 | 5/2014 | Tran et al. |
| 8,721,902 B1 | 5/2014 | Wang et al. |
| 8,724,259 B1 | 5/2014 | Liu et al. |
| 8,749,790 B1 | 6/2014 | Tanner et al. |
| 8,749,920 B1 | 6/2014 | Knutson et al. |
| 8,753,903 B1 | 6/2014 | Tanner et al. |
| 8,760,807 B1 | 6/2014 | Zhang et al. |
| 8,760,818 B1 | 6/2014 | Diao et al. |
| 8,760,819 B1 | 6/2014 | Liu et al. |
| 8,760,822 B1 | 6/2014 | Li et al. |
| 8,760,823 B1 | 6/2014 | Chen et al. |
| 8,763,235 B1 | 7/2014 | Wang et al. |
| 8,780,498 B1 | 7/2014 | Jiang et al. |
| 8,780,505 B1 | 7/2014 | Xiao |
| 8,786,983 B1 | 7/2014 | Liu et al. |
| 8,790,524 B1 | 7/2014 | Luo et al. |
| 8,790,527 B1 | 7/2014 | Luo et al. |
| 8,792,208 B1 | 7/2014 | Liu et al. |
| 8,792,312 B1 | 7/2014 | Wang et al. |
| 8,793,866 B1 | 8/2014 | Zhang et al. |
| 8,797,680 B1 | 8/2014 | Luo et al. |
| 8,797,684 B1 | 8/2014 | Tran et al. |
| 8,797,686 B1 | 8/2014 | Bai et al. |
| 8,797,692 B1 | 8/2014 | Guo et al. |
| 8,813,324 B2 | 8/2014 | Emley et al. |
| 2002/0064002 A1 | 5/2002 | Gill |
| 2004/0041183 A1 * | 3/2004 | Slaughter et al. ............. 257/295 |
| 2008/0179699 A1 * | 7/2008 | Horng et al. ................... 257/421 |
| 2008/0217710 A1 * | 9/2008 | Horng et al. ................... 257/421 |
| 2009/0251829 A1 * | 10/2009 | Zhang et al. ................... 360/319 |
| 2009/0279213 A1 | 11/2009 | Wu et al. |
| 2010/0039734 A1 * | 2/2010 | Hara et al. .................... 360/319 |
| 2010/0149689 A1 * | 6/2010 | Tsuchiya et al. ............ 360/234.3 |
| 2010/0290157 A1 | 11/2010 | Zhang et al. |
| 2011/0007425 A1 | 1/2011 | Vas'ko et al. |
| 2011/0086240 A1 | 4/2011 | Xiang et al. |
| 2011/0249365 A1 | 10/2011 | Zeltser et al. |
| 2012/0111826 A1 | 5/2012 | Chen et al. |
| 2012/0216378 A1 | 8/2012 | Emley et al. |
| 2012/0237878 A1 | 9/2012 | Zeng et al. |
| 2012/0298621 A1 | 11/2012 | Gao |
| 2013/0216702 A1 | 8/2013 | Kaiser et al. |
| 2013/0216863 A1 | 8/2013 | Li et al. |
| 2013/0257421 A1 | 10/2013 | Shang et al. |
| 2014/0154529 A1 | 6/2014 | Yang et al. |
| 2014/0175050 A1 | 6/2014 | Zhang et al. |

* cited by examiner

MAGNETIC SHIELD FOR MAGNETIC RECORDING HEAD

TECHNICAL FIELD

The present disclosure relates to magnetic recording technology, and in particular, to a magnetic shield for a magnetic recording head that is stable and exhibits efficient antiparallel coupling performance.

BACKGROUND

Data storage media density has significantly increased over the last several decades. Thin film recording head technology has advanced to keep up with increasing data storage media density through the advent of technologies such as giant magnetoresistive (GMR), tunneling magnetoresistive (TMR), or perpendicular magnetic recording (PMR). Each of these magnetic recording technologies may incorporate a magnetic shield as a component of the completed magnetic recording head system. As the various recording head technologies target smaller and smaller bit sizes, increased magnetic shield domain stabilization is required to reduce magnetic noise. One method of managing magnetic shield domain stability is to incorporate an anti-ferromagnetic material to bias the shield into a desired magnetic orientation, creating an antiparallel composite shield configuration. In such a configuration, the thin film recording sensor is surrounded by a soft bias material, and a pair of ferromagnetic layers separated by a spacer layer are deposited thereon, such that the upper ferromagnetic layer is magnetically pinned to the lower ferromagnetic layer, but separated by the spacer. In this shield configuration, as the spacer layer thickness is increased, magnetic coupling performance decreases, effectively limiting the spacer thickness. However, at very thin spacer thicknesses, shield stability decreases due to irregular grain growth in the ferromagnetic layers surrounding the spacer. The irregular growth increases with multiple anneals of the shield, and thus shield stability decreases with multiple anneals. This constraint requiring the spacer to be thicker to avoid shield instability, but thinner to maintain a strong antiparallel coupling performance, effectively limits the effectiveness of the currently available magnetic shields.

BRIEF DESCRIPTION OF THE DRAWINGS

Various embodiments are illustrated by way of example, and not limitation, in the figures of the accompanying drawings in which.

The figures are not intended to be exhaustive or to limit the invention to the precise form disclosed. It should be understood that the invention can be practiced with modification and alteration, and that the disclosed technology be limited only by the claims and the equivalents thereof.

DETAILED DESCRIPTION

In the following description, numerous specific details are set forth to provide a thorough understanding of various embodiment of the present disclosure. It will be apparent to one skilled in the art, however, that these specific details need not be employed to practice various embodiments of the present disclosure. In other instances, well known components or methods have not been described in detail to avoid unnecessarily obscuring various embodiments of the present disclosure.

As disclosed herein, a magnetic shield for a magnetic recording head may include a plurality of ferromagnetic layers, a buffer layer; and a spacer layer. For example, the ferromagnetic layers may be NiFe, the buffer layer may be CoFeB, and the spacer layer may be Ru. In some examples, the buffer layer is between 5 Angstroms and 50 Angstroms thick. In one example, the spacer layer is not more than 10 Angstroms thick Some embodiments of the disclosure provide a process for manufacturing a magnetic shield wherein the process includes depositing a plurality of ferromagnetic layers, depositing a buffer layer, and depositing a spacer layer. For example, a first ferromagnetic layer may be deposited on a magnetic sensor and soft bias layers, a buffer layer may be deposited on the first ferromagnetic layer, a second ferromagnetic layer may be deposited on the buffer layer, a spacer layer may be deposited on the second ferromagnetic layer, and a third ferromagnetic layer may be deposited on the spacer layer. In some examples, the ferromagnetic layers are NiFe. In some examples, the buffer layer is an amorphous CoFeB and the spacer layer is Ru. For example, the ferromagnetic layers may magnetically couple through the buffer layer and the spacer layer. In some embodiments, one or more antiferromagnetic layers are deposited on top of the magnetic shield.

Figure 1:
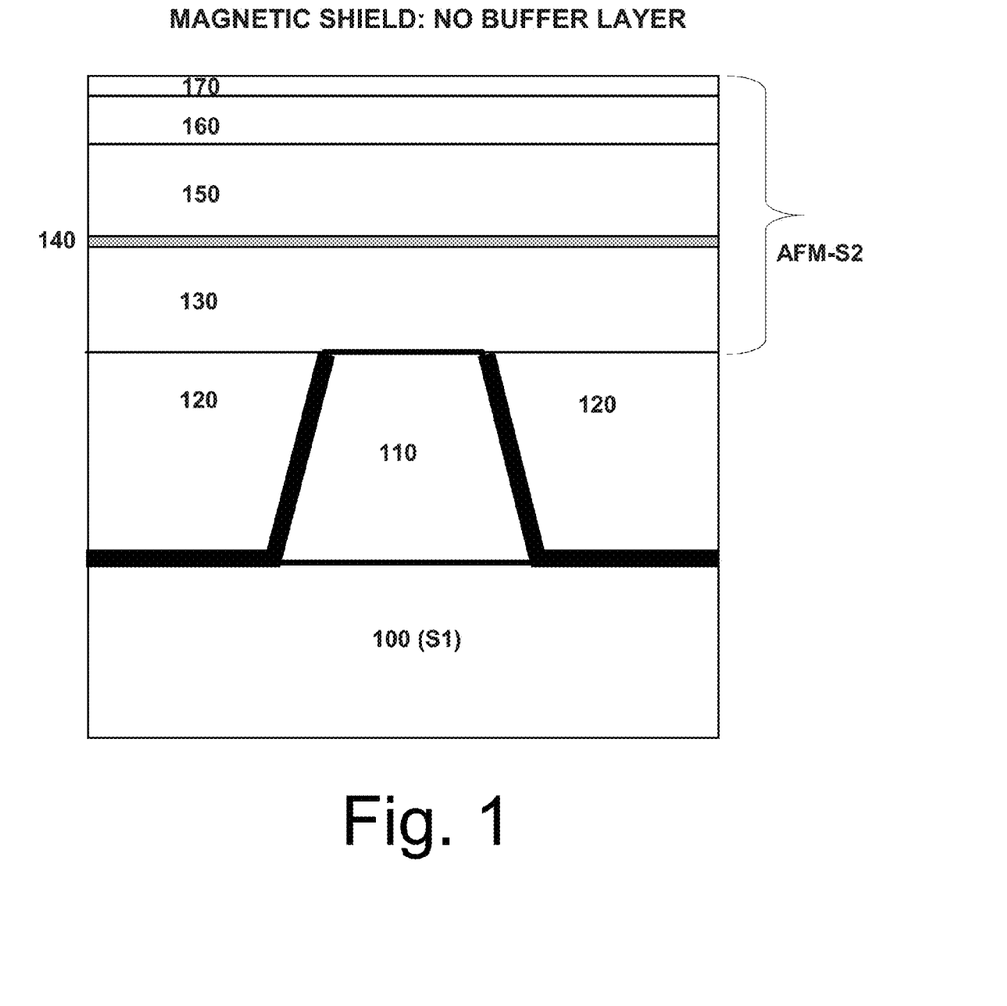
FIG. 1 illustrates a cross-section of a magnetic shield for a magnetic recording head without a buffer layer.

FIG. 1 shows a cross-section of a magnetic shield for a magnetic recording head without a buffer layer. As shown, a magnetic shield without a buffer layer may include ferromagnetic layers 130 and 150 and a spacer layer 140. For example, a thin film recording sensor 110 may be formed on substrate or on another magnetic shield 100, along with soft bias layer 120. A first ferromagnetic layer 130 may be deposited on the magnetic recording sensor 110, spacer 140 may be deposited on first ferromagnetic layer 130, and second ferromagnetic layer 150 may be deposited on spacer 140. In some examples, antiferromagnetic layer 160 may be deposited on second ferromagnetic layer 150, and cap 170 may be deposited on antiferromagnetic layer 160.

Magnetic recording sensor 110 may be either a giant magnetoresistive (GMR), tunneling magnetoresistive (TMR), or perpendicular magnetic recording (PMR) sensor, or other magnetic recording sensor as would be known in the art. The magnetic recording head may be a read head or a write head. In some examples, the magnetic shield may also be formed on both sides of the magnetic recording head. In other examples, the magnetic shield may be formed on a magnetic write head. The magnetic shield technology disclosed herein is not dependent on the method or form of the magnetic read or write head.

Still referring to FIG. 1, in some embodiments, the ferromagnetic layers 130 and/or 150 may be Fe, Ni, or NiFe. Other ferromagnetic alloys may be used as would be known in the art. Spacer 140 may include Ru. Antiferromagnetic layer 160 may include antiferromagnetic materials such as FeMn, IrMn, RuMn, NiO, PtMn, PtPdMn, NiMn, or other antiferromagnetic materials as would be known in the art.

Figure 2:
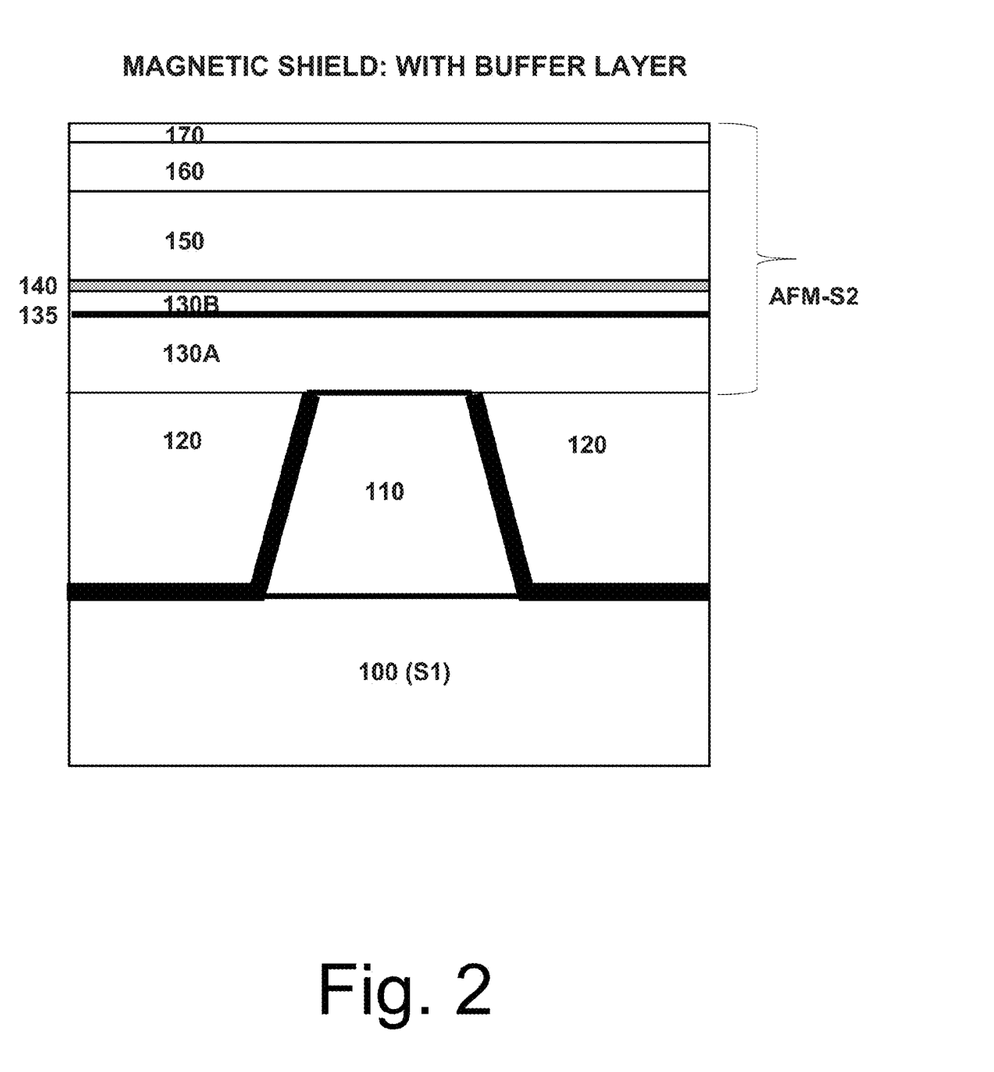
FIG. 2 illustrates a cross-section of a magnetic shield for a magnetic recording head with a buffer layer consistent with embodiments disclosed herein.

FIG. 2 illustrates a cross-section of a magnetic shield for a magnetic recording head with a buffer layer. An example magnetic shield with a buffer layer may include a plurality of ferromagnetic layers 130A, 130B, and 150, a buffer layer 135, and a spacer layer 140. For example, each ferromagnetic layer may include NiFe, CoFe, or other ferromagnetic material as would be known in the art. The buffer layer 135 may include Co, B, Fe, or an alloy that comprises any of Co, B, or Fe. The spacer layer 140 may include Ru.

In some example magnetic shields, the buffer layer 135 may comprise Co, Fe, and B in varying ratios to increase magnetic coupling efficiency through the ferromagnetic layers. For example, the buffer layer 135 may comprise $Co_xFe_yB$, where x, y, and z represent an atomic percent of the total number of atoms in the buffer layer such that, for a total of 100 atomic percent, $z=100-x-y$ and $z<35$ atomic percent. In several embodiments, buffer layer 135 may be amorphous (e.g. an amorphous CoFeB layer).

Some example buffer layers may comprise at least 70 atomic percent of Co, not more than 10 atomic percent of Fe, and not more than 20 atomic percent of B. Other example buffer layers may comprise between 35 atomic percent and 45 atomic percent Co, between 35 atomic percent and 45 atomic percent Fe, and between 15 atomic percent and 25 atomic percent B. Other example buffer layers may comprise between 0 atomic percent and 50 atomic percent Fe, between 10 atomic percent and 30 atomic percent B, and Co. In other examples, the buffer layer 135 may comprise Co and B, but without any, or only trace amounts of Fe.

In some embodiments of the disclosure, a buffer layer 135 as thin as 3 Angstroms provides sufficient magnetic coupling of the ferromagnetic layers with sufficient reduction of NiFe grain growth. In other embodiments, a buffer layer 135 as thick as 50 Angstroms provides sufficient magnetic coupling of the ferromagnetic layers with sufficient reduction of NiFe grain growth. Other buffer layer thicknesses may be used, as would be known to one of skill in the art, to provide sufficient magnetic and thermal stability by reducing NiFe grain growth while still providing sufficient magnetic coupling of the ferromagnetic layers.

Still referring to FIG. 2, spacer layer 140 may comprise Ru. In some examples, the spacer layer 140 may be between 2 Angstroms and 15 Angstroms thick in order to provide sufficient antiparallel (AP) coupling through the spacer layer. Other spacer thicknesses are possible, as would be known to one of skill in the art, to provide sufficient AP coupling through the spacer layer.

Figure 3:
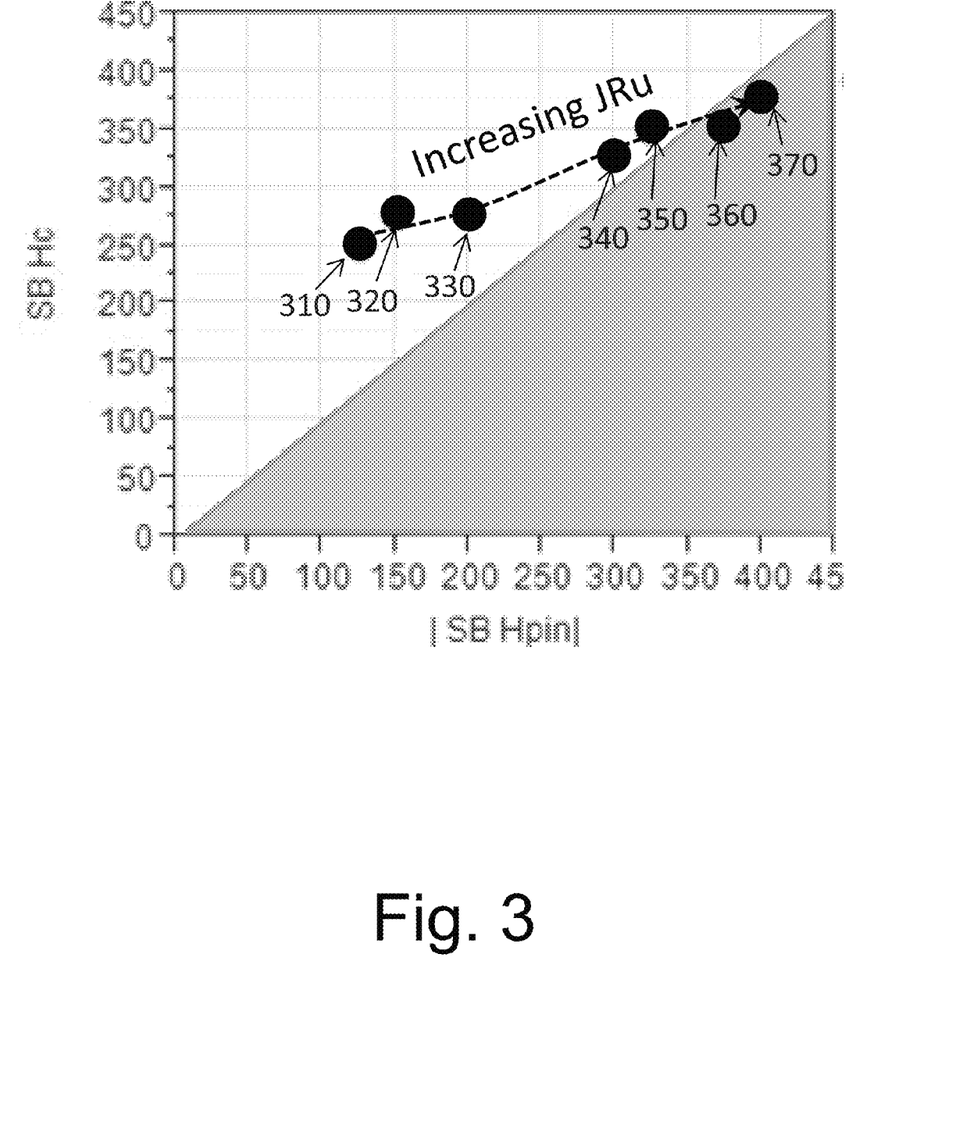
FIG. 3 is a graph showing increasing soft bias (SB) stability corresponding to increasing antiparallel coupling strength.

FIG. 3 is a graph showing increasing soft bias (SB) stability with Ru layer thickness corresponding to a peak antiparallel coupling strength. In particular, the graph is a phase diagram showing the coercivity ($H_c$) of the magnetic shield on the y-axis and the magnetic pin field strength on on the x-axis. The stability line demonstrates that SB stability exists when $H_c<H_{pin}$. The data points shown on the right of the stability line (points 360 and 370) demonstrate magnetic shield stability that accomplished with higher magnetic coupling strength (jRu) and with a buffer layer, as disclosed with respect to FIG. 2 above, is incorporated into the magnetic shield. Data points 310, 320, 330, 340, and 350 demonstrate a lower SB stability achieved with smaller magnetic coupling strength and without incorporating a buffer layer.

Figure 4A:
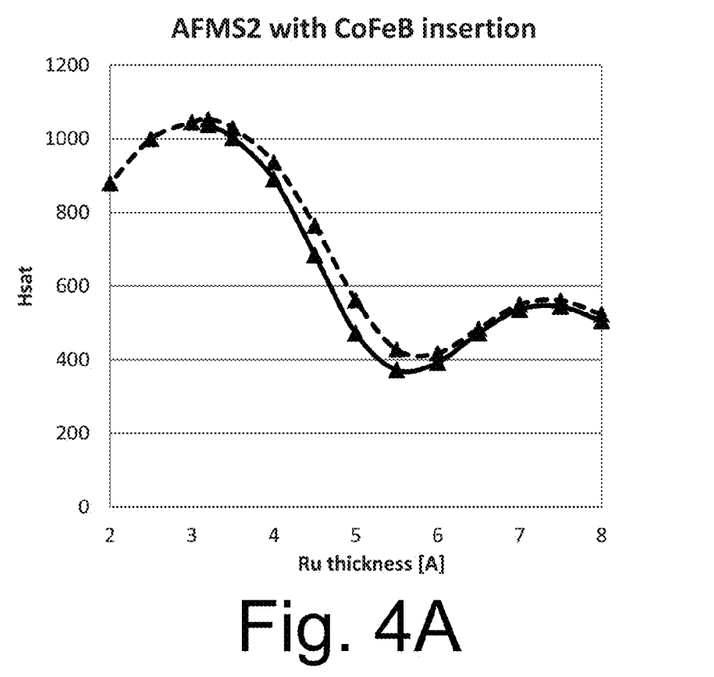
FIG. 4A is a graph illustrating magnetic coupling strength in relation to Ru layer thickness for example magnetic shields that incorporate a buffer layer consistent with embodiments disclosed herein.

FIG. 4A is a graph illustrating saturation field level in relation to Ru layer thickness when a buffer layer, as disclosed herein with respect to FIG. 2, is incorporated in the magnetic shield. As illustrated, AP coupling strength is efficient and presents peaks for Ru spacer thicknesses of between 3 Angstroms and 4 Angstroms (the first peak), and again for thicknesses between 7 Angstroms and 8 Angstroms (the second peak). Other peaks may exist for other spacer thicknesses outside of the scale shown in FIG. 4A. The dashed curve in FIG. 4A shows changes in magnetic coupling strength with increasing spacer layer thickness for newly grown ferromagnetic layers. The solid line in FIG. 4A shows changes in magnetic coupling strength with increasing spacer layer thickness for a magnetic shield after a first anneal process. As demonstrated by comparing the two curve lines in FIG. 4A, when a buffer layer is present, there is minimal change to the magnetic coupling strength properties of the magnetic shield layers following an anneal process.

Figure 4B:
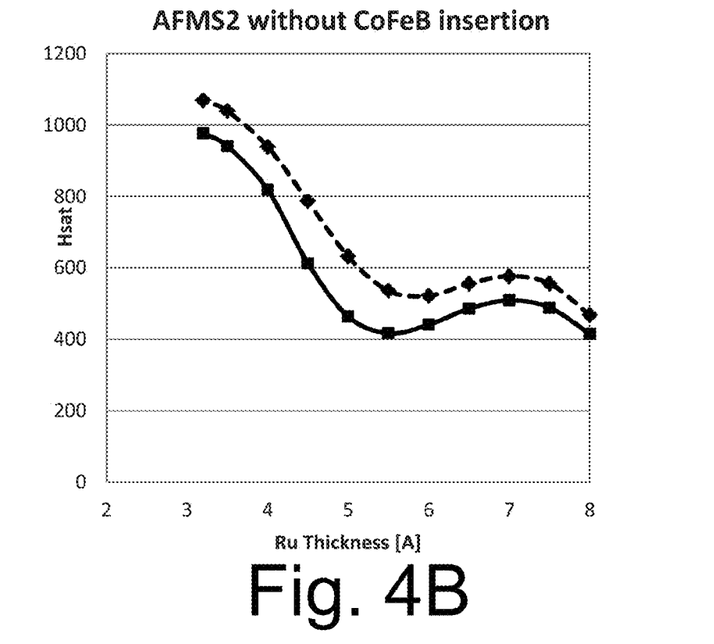
FIG. 4B is a graph illustrating magnetic coupling strength in relation to Ru layer thickness for magnetic shields that do not incorporate a buffer layer.

FIG. 4B is a graph illustrating saturation field level in relation to Ru layer thickness when no buffer layer is incorporated in the magnetic shield. As illustrated by FIG. 4B, as spacer thickness increases, AP coupling strength still presents a first peak between 3 Angstroms and 4 Angstroms and a second peak between 7 Angstroms and 8 Angstroms. Similar to the graph in FIG. 4A, the dashed curve in FIG. 4B shows changes in magnetic coupling strength with increasing spacer layer thickness for newly grown ferromagnetic layers. The solid line in FIG. 4B shows changes in magnetic coupling strength with increasing spacer layer thickness for a magnetic shield after a first anneal process. As demonstrated by comparing the two curve lines in FIG. 4B, when no buffer layer is present, there is an increased degradation in magnetic coupling strength with each anneal of the magnetic shield.

Figure 5A:
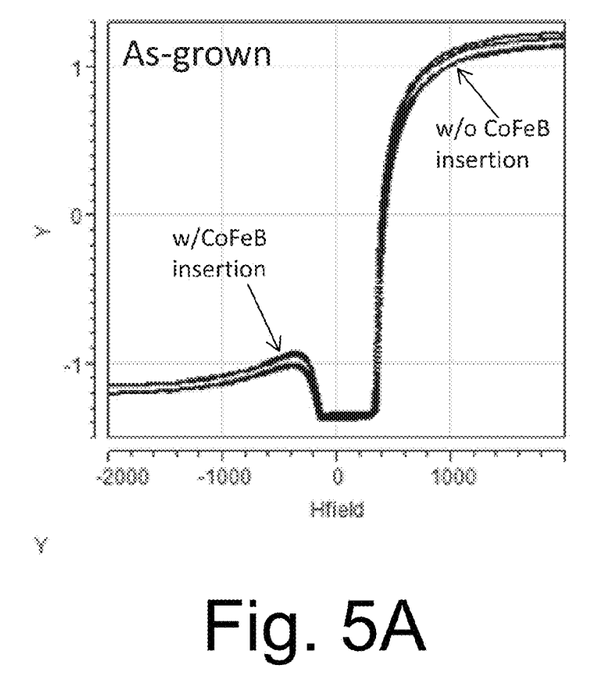
FIG. 5A is a Magneto-Optical Kerr Effect (MOKE) graph comparing the magnetic alignment in response to an external magnetic field between a magnetic shield with a buffer layer and a magnetic shield without a buffer layer prior to exposure to an anneal process.

FIG. 5A is a graph comparing MOKE curves that demonstrate magnetic coupling performance within a magnetic shield as grown (before an anneal process). A MOKE curve illustrates magnetic alignment in response to an external magnetic field at the surface of a magnetic material by reflecting polarized light off of the service while rotating the plane of polarization. The MOKE instrument detects changes in the returned light that depend on the properties of the magnetic field at the material's surface. As illustrated by FIG. 5A, the magnetic properties at the surface of a magnetic shield, before any anneal process, are similar for magnetic shields with a buffer layer and magnetic shields without a buffer layer.

Figure 5B:
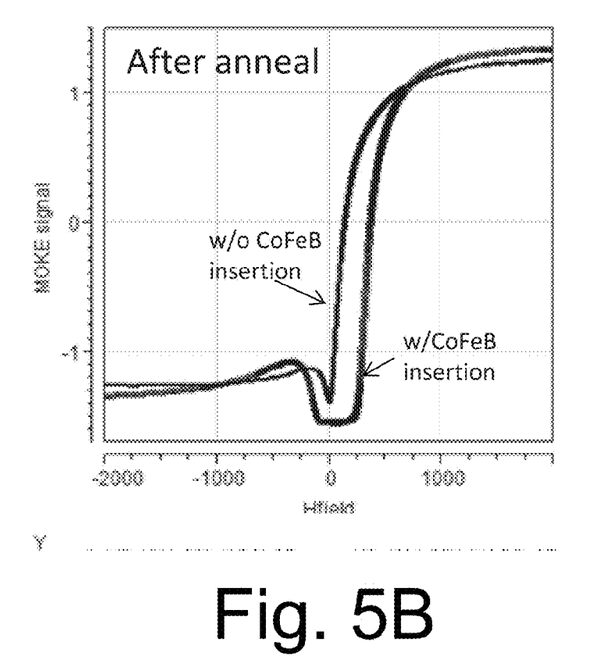
FIG. 5B is a MOKE graph comparing the magnetic alignment in response to an external magnetic field between a magnetic shield with a buffer layer and a magnetic shield without a buffer layer following exposure to an anneal process.

FIG. 5B is a graph comparing MOKE curves that demonstrate magnetic coupling performance within a magnetic shield following an anneal process. As illustrated by FIG. 5B, the magnetic properties at the surface of the magnetic shield with a buffer layer remain relatively uniform after an anneal process. However, the magnetic properties at the surface of a magnetic shield without a buffer layer show large variance after exposure to an anneal process. Accordingly, the buffer layer increases the magnetic shields magnetic coupling strength stability, even after exposure to an anneal process.

Figure 6:
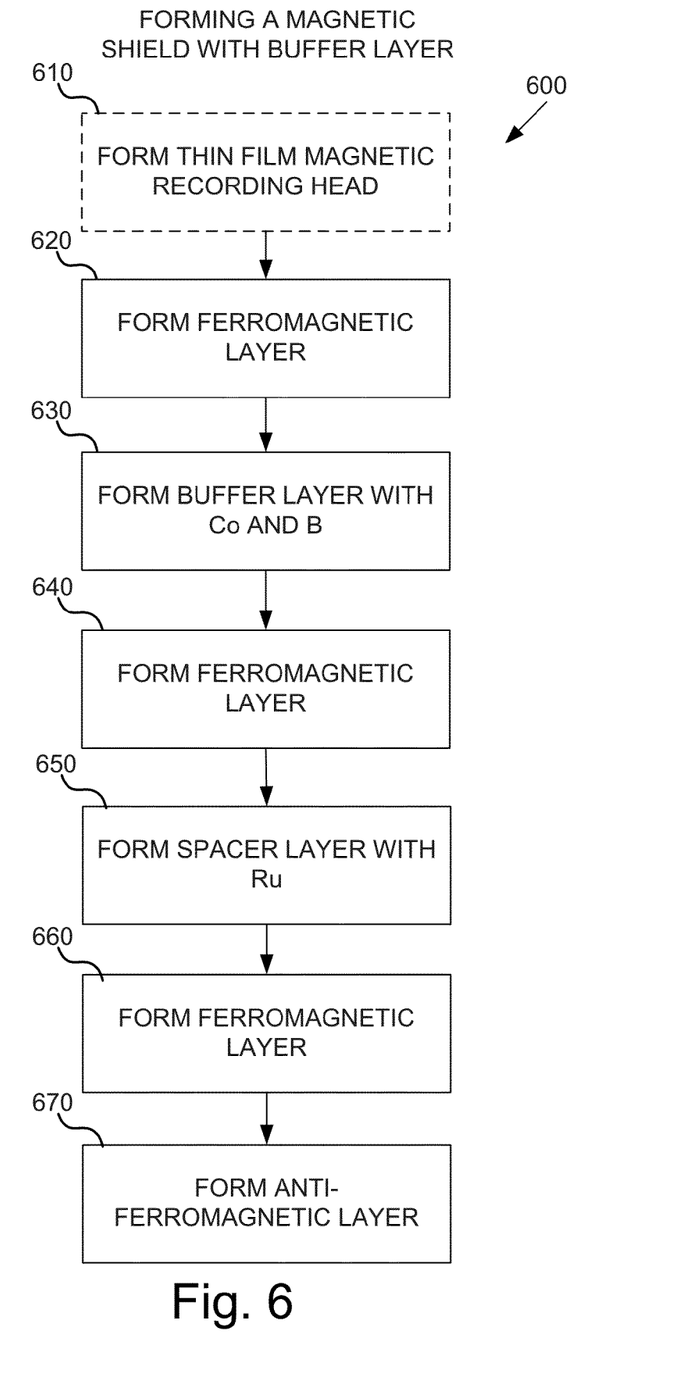
FIG. 6 is a process flow chart illustrating a method for forming a magnetic shield with a buffer layer consistent with embodiments disclosed herein.

FIG. 6 is a process flow chart illustrating a method for forming a magnetic shield with a buffer layer consistent with embodiments disclosed herein. A method for forming a magnetic shield with a buffer layer may include forming a first ferromagnetic at step 620, forming an amorphous buffer layer with Co and B at step 630, and forming a second ferromagnetic layer at step 640. The method may also include forming a spacer layer of Ru at step 650 and a third ferromagnetic layer at step 660. The method may also include forming an antiferromagnetic layer at step 670.

Still referring to FIG. 6, the forming of ferromagnetic layers at steps 620, 640, and 660 may include depositing CoFe or NiFe. In some examples, the first ferromagnetic layer of step 620 and third ferromagnetic layer of step 660 comprise CoFe, and the second ferromagnetic layer of step 640 comprises NiFe. In other examples, all three ferromagnetic layers comprise NiFe. The CoFe and NiFe layers may be layered in alternate orders, or incorporate other ferromagnetic materials as would be known to one of skill in the art. For example, the film stack may be layered with NiFe—CoFe—Ru—CoFe—NiFe, or NiFe—CoFe-AFM, or in other alternating fashion so long as it includes multiple ferromagnetic layers with a spacer layer and a buffer layer sandwiched therebetween.

Still referring to FIG. 6, the forming of antiferromagnetic layer at step 670 may include depositing FeMn, IrMn, RuMn, NiO, PtMn, PtPdMn, NiMn, or other antiferromagnetic materials as would be known in the art. In some examples, the first ferromagnetic layer of step 620 may be deposited underneath (on the alternate side) of the thin film magnetic recording sensor and soft-bias layer formed at step 610. This configuration may be referred to as a "bottom shield" film stack configuration as opposed to a "top shield" configuration as shown in FIG. 2.

Still referring to FIG. 6, in some examples, the Ru spacer layer formed in step 650 may be formed to a thickness corresponding to the first peak as disclosed with respect to FIG. 4A. For example, the Ru layer thickness may be between 3 Angstroms and 4 Angstroms. In other examples, the Ru spacer layer formed in step 650 may be formed to a thickness corresponding to the second peak as disclosed with respect to FIG. 4A. For example, the Ru layer thickness may be between 7 Angstroms and 8 Angstroms. Other spacer layer thicknesses may be used to optimize AP coupling and field saturation strength. Similar to the magnetic shield disclosed in FIG. 2, the buffer layer of step 630 may be deposited as thin as 3 Angstroms, but because the disclosed buffer layer exhibits magnetic properties, it may also be formed to thicknesses upwards of 50 Angstroms or more without overly degrading AP coupling performance and shield stability. Accordingly, thicker buffer layers may be deposited if necessary to reduce irregular grain growth in the ferromagnetic layers around the spacer layer.

Although described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the application, whether or not such embodiments are described and whether or not such features are presented as being a part of a described embodiment. Thus, the breadth and scope of the present application should not be limited by any of the above-described exemplary embodiments.

The terms "over," "under," "between," and "on" as used herein refer to a relative position of one media layer with respect to other layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in contact with that second layer. Additionally, the relative position of one layer with respect to other layers is provided assuming operations are performed relative to a substrate without consideration of the absolute orientation of the substrate.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A magnetic shield for a magnetic recording head, the magnetic shield comprising:
    a plurality of ferromagnetic layers;
    a buffer layer comprising Co and B; and
    a spacer layer located between two of the ferromagnetic layers;
    wherein the buffer layer comprises between 35 atomic percent and 45 atomic percent Co, between 35 atomic percent and 45 atomic percent Fe, and between 15 atomic percent and 25 atomic percent B; and
    the spacer layer is not more than 10 Angstroms thick.

2. The magnetic shield of claim 1, wherein the buffer layer is at least 5 Angstroms and not more than 50 Angstroms thick.

3. A magnetic shield for a magnetic recording head, the magnetic shield comprising:
    a first ferromagnetic layer comprising Ni and Fe;
    a second ferromagnetic layer comprising Ni and Fe;
    a third ferromagnetic layer comprising Ni and Fe;

a buffer layer comprising Co and B; and a spacer layer comprising Ru;

wherein the buffer layer comprises between 35 atomic percent and 45 atomic percent Co, between 35 atomic percent and 45 atomic percent Fe, and between 15 atomic percent and 25 atomic percent B;

the spacer layer is not more than 10 Angstroms thick;

the first ferromagnetic layer is located above a magnetic sensor, the buffer layer is above the first ferromagnetic layer, the second ferromagnetic layer is above the buffer layer, the spacer layer is above the second ferromagnetic layer, and the third ferromagnetic layer is above the spacer layer; and the first ferromagnetic layer magnetically couples through the buffer layer to the second ferromagnetic layer.

* * * * *